(12) United States Patent
Xie et al.

(10) Patent No.: US 6,417,093 B1
(45) Date of Patent: Jul. 9, 2002

(54) PROCESS FOR PLANARIZATION OF METAL-FILLED TRENCHES OF INTEGRATED CIRCUIT STRUCTURES BY FORMING A LAYER OF PLANARIZABLE MATERIAL OVER THE METAL LAYER PRIOR TO PLANARIZING

(75) Inventors: James J. Xie; Ronald J. Nagahara, both of San Jose; Jayanthi Pallinti, Santa Clara; Akihisa Ueno, Cupertino, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/703,745

(22) Filed: Oct. 31, 2000

(51) Int. Cl.$^7$ ............................................ H01L 21/4763
(52) U.S. Cl. ...................... 438/626; 438/627; 438/633; 438/645; 438/648; 438/687
(58) Field of Search ................................. 438/633, 626, 438/627, 645, 687, 628, 625, 692, 648

(56) References Cited

U.S. PATENT DOCUMENTS

| | | | |
|---|---|---|---|
| 4,471,525 A | | 9/1984 | Sasaki |
| 5,399,520 A | | 3/1995 | Jang |
| 5,512,509 A | | 4/1996 | Han |
| 5,618,381 A | * | 4/1997 | Doan et al. |
| 5,665,635 A | | 9/1997 | Kwon et al. |
| 5,681,776 A | | 10/1997 | Hebert et al. |
| 6,017,803 A | * | 1/2000 | Wong |
| 6,051,496 A | * | 4/2000 | Jang |
| 6,069,082 A | * | 5/2000 | Wong et al. |
| 6,103,625 A | * | 8/2000 | Marcyk et al. |
| 6,114,218 A | | 9/2000 | Jeng |
| 6,114,246 A | * | 9/2000 | Weling |
| 6,169,028 B1 | * | 1/2001 | Wang et al. |
| 6,258,711 B1 | * | 7/2001 | Laursen |

FOREIGN PATENT DOCUMENTS

| | | |
|---|---|---|
| JP | 62-014439 | 1/1987 |
| JP | 01-282839 | 11/1989 |

* cited by examiner

Primary Examiner—Keith Christianson
Assistant Examiner—Stephen W. Smoot
(74) Attorney, Agent, or Firm—John P. Taylor

(57) ABSTRACT

A process for forming an integrated circuit structure wherein trenches and/or vias are formed in a predetermined pattern in a dielectric layer, lined with a barrier layer of a first electrically conductive material, and then filled with a second electrically conductive material, and the structure is then planarized to remove the first and second electrically conductive material from the upper surface of the dielectric layer, wherein the improvements comprise:

a) before the planarizing step, forming over the second electrically conductive material a layer of a planarizable material capable of being planarized at about the same rate as the first electrically conductive material; and b) then planarizing the structure to remove:
   i) the planarizable material;
   ii) the second electrically conductive material; and
   iii) the first electrically conductive material;
   above the upper surface of the dielectric material;

whereby the planarizable material above the second electrically conductive material in the trenches protects the second electrically conductive material while the first electrically conductive material is being removed from the upper surface of the dielectric layer by the planarizing step to prevent erosion of the upper surface of the second electrically conductive layer.

23 Claims, 4 Drawing Sheets

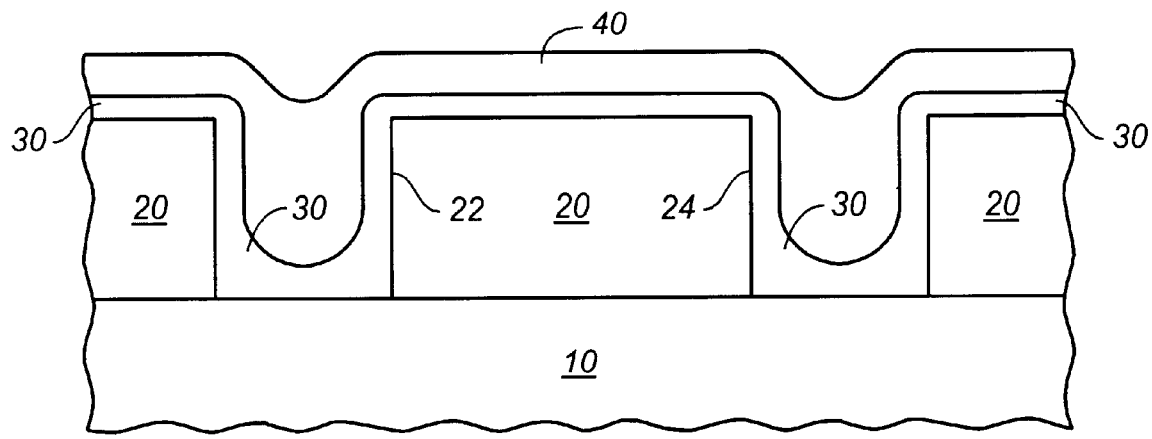
FIG._1 *(PRIOR ART)*
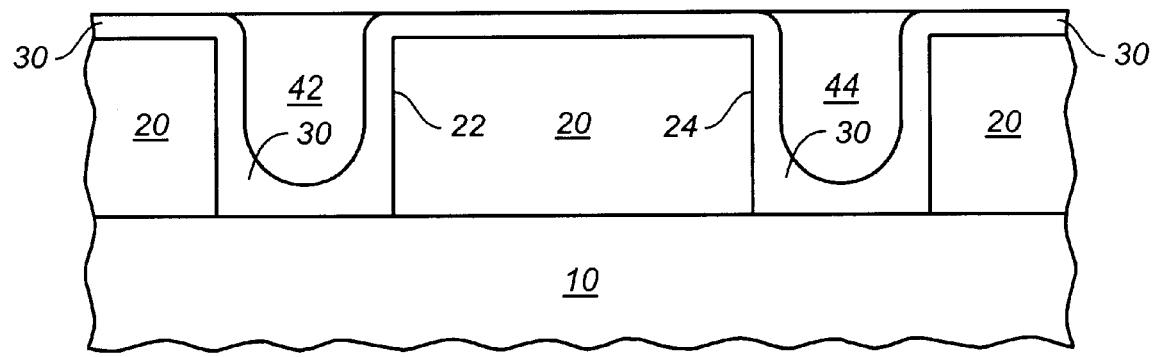
FIG._2 *(PRIOR ART)*
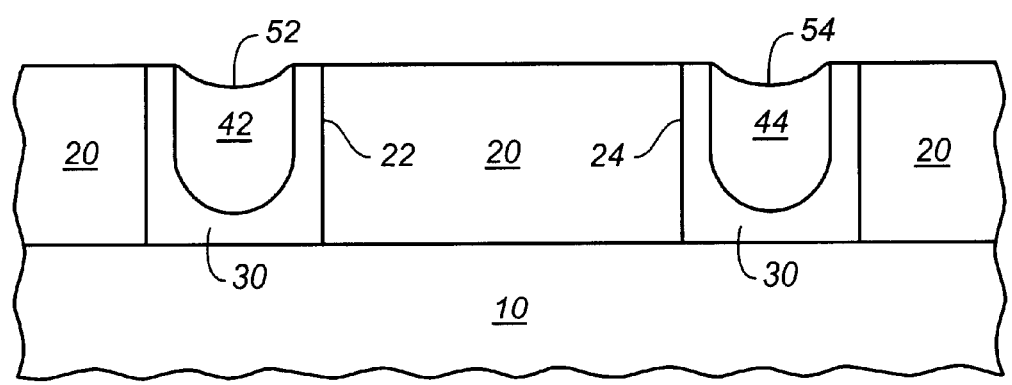
FIG._3 *(PRIOR ART)*

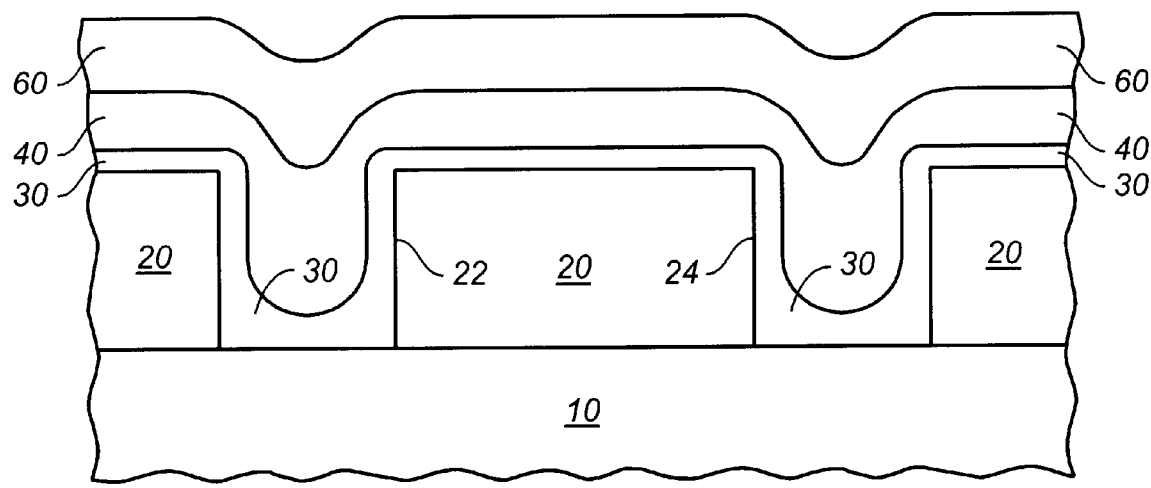
FIG._4
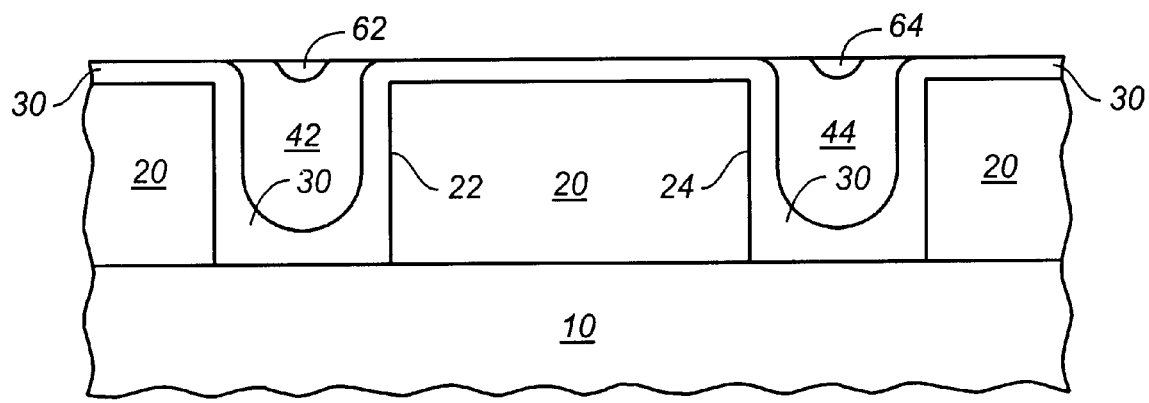
FIG._5
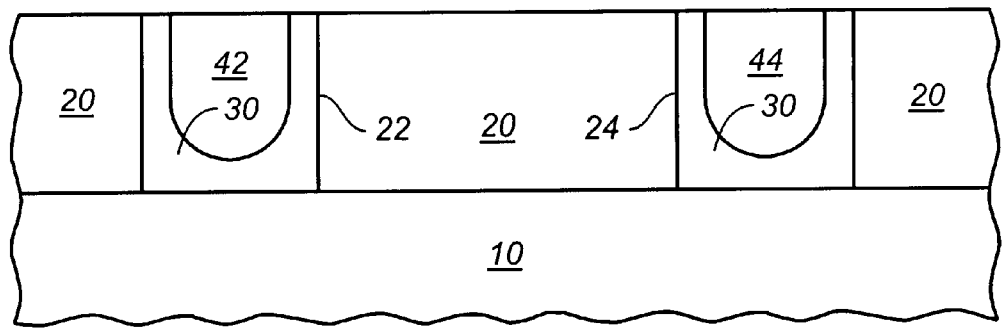
FIG._6

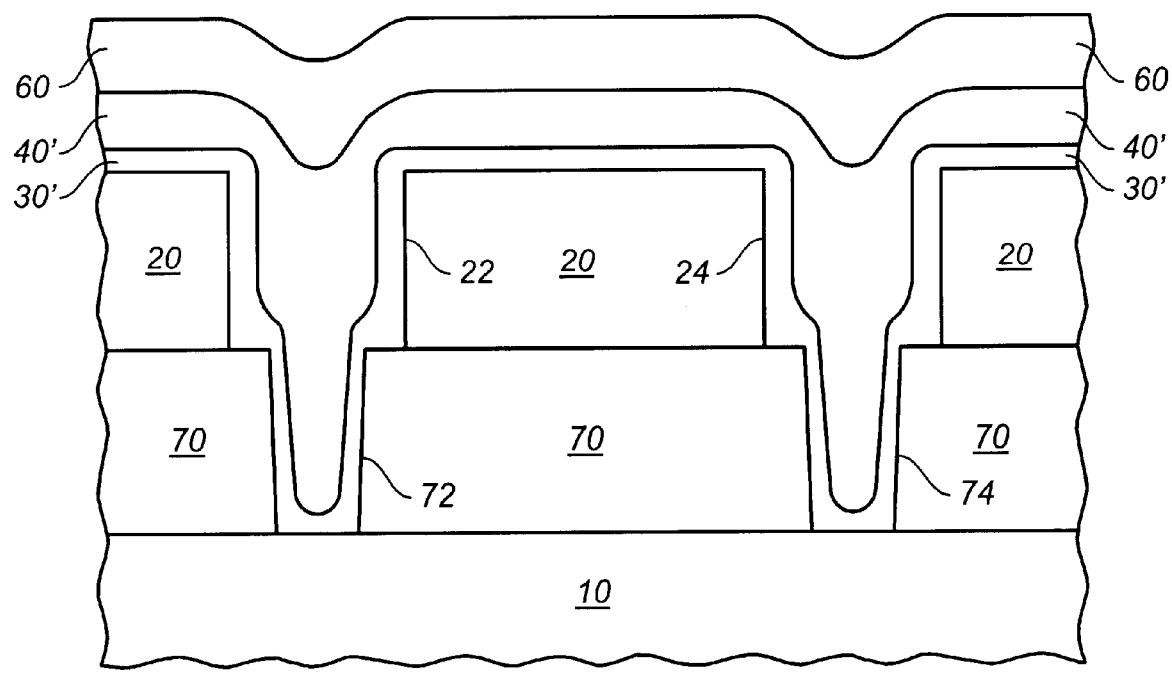
FIG._7
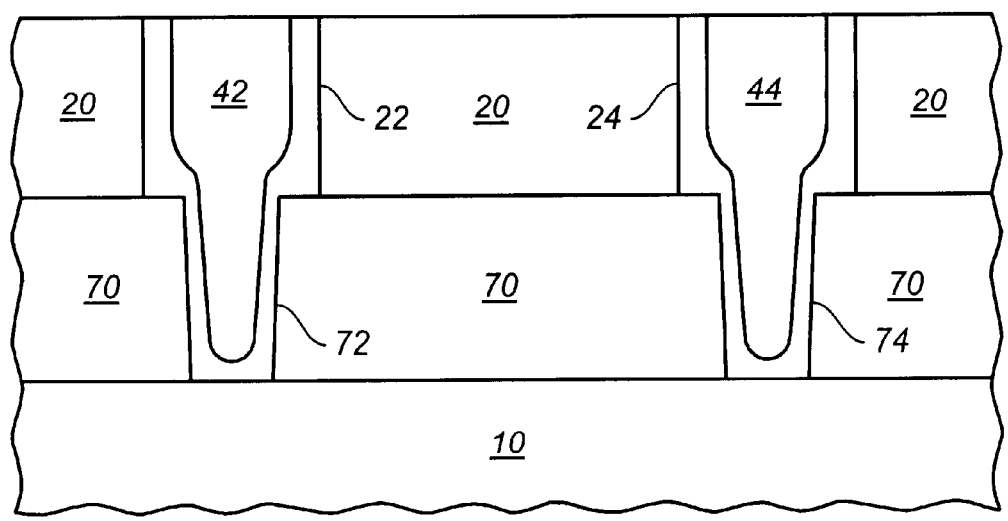
FIG._8

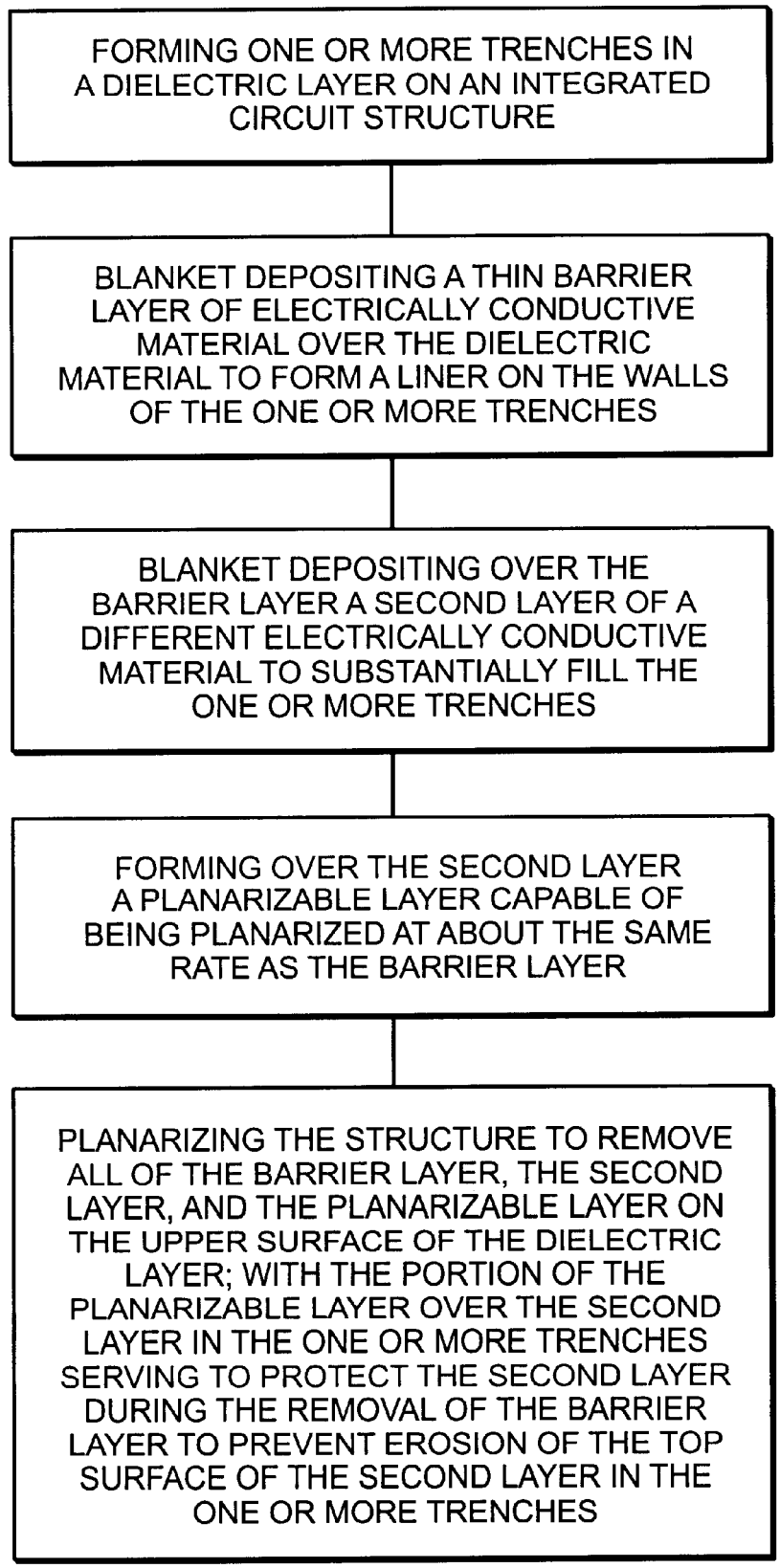
FIG._9

PROCESS FOR PLANARIZATION OF METAL-FILLED TRENCHES OF INTEGRATED CIRCUIT STRUCTURES BY FORMING A LAYER OF PLANARIZABLE MATERIAL OVER THE METAL LAYER PRIOR TO PLANARIZING

CROSS REFERENCE TO RELATED APPLICATIONS

The subject matter of this application relates to the subject matter of U.S. patent application Ser. No. 09/703,616, filed on Oct. 31, 2000, entitled "PROCESS FOR CMP REMOVAL OF EXCESS TRENCH OR VIA FILLER METAL WHICH INHIBITS FORMATION OF CONCAVE REGIONS ON OXIDE SURFACE OF INTEGRATED CIRCUIT STRUCTURE", and assigned to the assignee of this application.

The subject matter of this application relates to the subject matter of U.S. patent application Ser. No. 09/704,164, filed on Oct. 31, 2000, entitled "PROCESS FOR FORMING LOW K DIELECTRIC MATERIAL BETWEEN METAL LINES", and assigned to the assignee of this application.

The subject matter of this application relates to the subject matter of U.S. patent application Ser. No. 09/704,200, filed on Oct. 31, 2000, entitled "PROCESS FOR FORMING INTEGRATED CIRCUIT STRUCTURE WITH LOW DIELECTRIC CONSTANT MATERIAL BETWEEN CLOSELY SPACED APART METAL LINES", and assigned to the assignee of this application.

The subject matter of this application relates to the subject matter of U.S. patent application Ser. No. 09/425,552, filed on Oct. 22, 1999, entitled "INTEGRATED CIRCUIT STRUCTURE HAVING LOW DIELECTRIC CONSTANT MATERIAL AND HAVING SILICON OXYNITRIDE CAPS OVER CLOSELY SPACED APART METAL LINES", and assigned to the assignee of this application.

The subject matter of this application relates to the subject matter of U.S. patent application Ser. No. 09/605,380, filed on Jun. 27, 2000, entitled "COMPOSITE LOW DIELECTRIC CONSTANT FILM FOR INTEGRATED CIRCUIT STRUCTURE", and assigned to the assignee of this application.

BACKGROUND OF THE INVENTION

1. Field of the Invention

This invention relates to the formation of integrated circuit structures. More particularly this invention relates to the planarizing, by chemical-mechanical polishing, of metal-filled trenches of integrated circuit structures.

2. Description of the Related Art

Aluminum and tungsten metals have long been used in integrated circuit structures as filler materials for vias and contact openings as well as for the construction of metal lines or interconnects. However, with ever increasing demands for faster speeds, there has been renewed interest in the use of copper as a filler material for vias and contact openings instead of tungsten, as well as for use in metal lines instead of aluminum because of the well know low resistance of copper, compared to either aluminum or tungsten.

But there are negative aspects to the choice of copper for via filling or in the formation of metal lines. The usual patterning of a blanket-deposited metal layer through a mask to form a pattern of metal lines or interconnects cannot easily be carried out using copper, resulting in the need to first deposit a dielectric layer such as silicon oxide, and then form a series of trenches in the dielectric layer corresponding to the desired pattern of metal lines or interconnects. The trench surfaces are then lined with a barrier layer or liner (to prevent migration of copper into the dielectric material, as well as to promote adhesion of the filler metal to the trench surfaces), and then filled with copper metal by respective blanket depositions. Finally, the surface portions of both the barrier layer and the copper layer, formed over the top surface of the dielectric layer during the blanket depositions, are removed using a planarization process such as a chemical-mechanical polishing (CMP), leaving the desired pattern of metal lines or interconnects in the trenches, with the copper metal in the trenches separated from the silicon oxide sidewalls of the trench by the barrier layer.

While the copper lines or interconnects formed using such procedures provide the desired increased speed of the conductor, and the presence of the barrier layer between the copper and the silicon oxide dielectric material addresses the problem of diffusion of the copper ions or atoms into the silicon oxide sidewalls, the removal of the surface portions of both the barrier layer and the copper layer by chemical-mechanical polishing (CMP) can result in erosion of the surface portion of the copper remaining in the trench, due to the non-homogeneous removal of the barrier layer and the copper by the CMP process once the surface of the barrier layer is reached and exposed during the CMP process.

Turning now to prior art FIGS. 1–3, the formation of copper interconnects or lines in a dielectric layer of an integrated circuit structure, in accordance with the prior art, will be illustrated, using the so-called single damascene process, it being understood that the same planarizing problems are also present when using the dual damascene process. As shown in FIG. 1, a first silicon oxide dielectric layer 20 may be formed over an integrated circuit structure 10 which may comprise active devices previously formed in an underlying silicon substrate and filled vias or contact openings previously formed in an underlying dielectric layer. Such vias or contact openings provide connection, for example, with underlying gate electrodes and source/drain regions of MOS devices of integrated circuit structure 10 formed in the silicon substrate, as is well known to those skilled in the art.

Still referring to FIG. 1, formed in silicon oxide dielectric layer 20, are trenches 22 and 24. Trenches 22 and 24 may be formed in dielectric layer 20, for example, by etching dielectric layer 20 through a resist mask, to divide dielectric layer 20 into the illustrated pattern of trenches in dielectric layer 20. Trenches 22 and 24 represent or illustrate a series of trenches generally formed in dielectric layer 20 in a pattern corresponding to a desired array of metal lines to electrically interconnect, for example, underlying filled vias or contact openings (and the devices connected thereto) with other portions of the integrated circuit structure.

Over trenches 22 and 24 and the illustrated upper surfaces of dielectric layer 20, is formed an electrically conductive highly conformal barrier layer 30 comprising, for example, tantalum metal, tantalum nitride, tungsten metal, tungsten nitride, titanium metal, or titanium nitride, or combinations of same. Barrier layer 30 is blanket deposited over the surfaces of trenches 22 and 24, and the upper surface of dielectric layer 20, by a suitable deposition process such as chemical vapor deposition (CVD), plasma enhanced chemical vapor deposition (PECVD), physical vapor deposition (PVD), or any other suitable deposition process to a thickness of, for example, from about 100 Å to about 1000 Å.

Following the formation of barrier layer 30, a layer of copper metal 40 is blanket deposited over the structure by any suitable deposition process to completely fill the remaining portions of trenches 22 and 24, as well as depositing over the portions of barrier layer 30 previously deposited on the top surfaces of silicon oxide dielectric layer 20, as also shown in FIG. 1.

Following the blanket deposition of copper layer 40, the structure is subject to a chemical-mechanical polishing (CMP) process to remove all of the copper on the portions of barrier layer 30 on the top surfaces of dielectric layer 20, as shown in prior art FIG. 2, leaving only copper portions 42 and 44 in respective trenches 22 and 24. After removal of all such copper from the top surfaces of layer 20, the CMP process is continued to remove all underlying portions of barrier layer 30 over the top surfaces of dielectric layer 20, leaving only a liner of barrier material on the walls of the trenches separating the copper metal in trenches 22 and 24 from the silicon oxide surfaces or walls of the trenches, as shown in prior art FIG. 3.

The initial CMP planarization, resulting in the structure shown in prior art FIG. 2, basically comprises the uniform removal of the upper portions of previously deposited copper layer 40, and this portion of the CMP process proceeds until the upper surface of barrier layer 30 is encountered, i.e., exposed. However, to then remove the portions of barrier layer 30 lying over the upper surface of oxide layer 20 requires further polishing and it has been found that such further polishing results in removal of the upper surface of the copper in trenches 22 and 24 at a faster rate than the removal of the portions of barrier layer 30 lying over the top surface of dielectric layer 20. The result, as shown in prior art FIG. 3, is erosion of the exposed surface of the copper, leaving a dished or concave upper surface of the copper filler material in trenches 22 and 24, as shown, respectively, at 52 and 54 in trenches 22 and 24. Furthermore, while the problem of surface erosion of the metal trench filler material during CMP planarization has been discussed and illustrated with respect to its occurrence with copper, the problem also exists when tungsten is used instead of copper, which includes, for example, in vias or contact openings where tungsten is used more often as the filler material.

It would, therefore, be desirable if the process for forming a pattern of metal interconnects or lines in previously formed trenches and/or vias in a layer of insulation material could be carried out without erosion of the metal surface of the filler metal in the trenches.

SUMMARY OF THE INVENTION

An improved process is provided for forming an integrated circuit structure wherein trenches are formed in a predetermined pattern in a dielectric layer, lined with a barrier layer of a first electrically conductive material, and then filled with a filler layer of a second electrically conductive material, and the structure is then planarized to remove the first and second electrically conductive materials from the upper surface of the dielectric layer, wherein the improvements comprise:
  a) before the planarizing step, forming over the filler layer of second electrically conductive material a layer of a planarizable material capable of being planarized at about the same rate as the barrier layer comprising the first electrically conductive material; and
  b) then planarizing the structure to remove:
    i) the planarizable material;
    ii) the second electrically conductive material; and
    iii) the first electrically conductive material;
      above the upper surface of the dielectric material;

whereby the planarizable material above the second electrically conductive material in the trenches protects the second electrically conductive material while the first electrically conductive material is being removed from the upper surface of the dielectric layer by the planarizing step to prevent erosion of the upper surface of the second electrically conductive layer.

BRIEF DESCRIPTION OF THE DRAWINGS

FIG. 1 is a fragmentary vertical cross-sectional view of a prior art integrated circuit structure showing a layer of dielectric material on an integrated circuit structure with trenches formed in the dielectric layer, a barrier layer of a first electrically conductive material lining the trenches and also deposited over the upper surface of the dielectric layer, and a filler layer of a second electrically conductive material such as copper over the barrier layer to fill up the remainder of the trenches.

FIG. 2 is a fragmentary vertical cross-sectional view of the prior art structure of FIG. 1 after a sufficient amount of the filler layer of second electrically conductive material has been removed to expose the portion of the barrier layer of first electrically conducive material lying over the top surface of the dielectric layer.

FIG. 3 is a fragmentary vertical cross-sectional view of the prior art structure of FIG. 2 after the removal of the remainder of the barrier layer of first electrically conductive material lying on the upper surface of the dielectric layer, showing the resultant erosion of the upper surface of the second electrically conductive material in the trenches.

FIG. 4 is a fragmentary vertical cross-sectional view of the prior art structure of FIG. 1 after formation of a planarizable layer over the filler layer of second electrically conductive material, in accordance with the invention, prior to the planarization step.

FIG. 5 is a fragmentary vertical cross-sectional view of the structure of FIG. 4 after a sufficient amount of the planarizable layer and the filler layer of second electrically conductive material have been removed to expose the portion of the first electrically conducive material lying over the top surface of the dielectric layer, and showing portions of the planarizable layer remaining over the filler layer of second electrically conductive material in the trenches, in accordance with the invention.

FIG. 6 is a fragmentary vertical cross-sectional view of the structure of FIG. 5, after the removal of the remainder of the barrier layer of first electrically conductive material lying on the upper surface of the dielectric layer, showing the planarized upper surface of the second electrically conductive material in the trenches due to the protection of the planarizable material during the removal of the barrier layer of first electrically conductive material from the upper surface of the dielectric layer.

FIG. 7 is a fragmentary vertical cross-sectional view of a structure similar to FIG. 4, except for the presence of an additional dielectric layer with vias therein shown formed beneath the dielectric layer of FIG. 4, with the vias in registry with the overlying trenches.

FIG. 8 is a fragmentary vertical cross-sectional view of the structure of FIG. 7 after the removal of the barrier layer of first electrically conductive material lying on the upper surface of the upper dielectric layer, showing the planarized upper surface of the second electrically conductive material in the trenches and vias.

FIG. 9 is a flow sheet illustrating one embodiment of the process of the invention.

DETAILED DESCRIPTION OF THE INVENTION

The invention comprises an improved process for forming an integrated circuit structure wherein trenches are formed in a predetermined pattern in a dielectric layer, lined with a barrier layer of a first electrically conductive material, and then filled with a filler material of second electrically conductive material, and the structure is then planarized to remove the first and second electrically conductive material from the upper surface of the dielectric layer. The improvements to the process comprise:

a) before the planarizing step, forming over the filler layer of second electrically conductive material a layer of a planarizable material preferably capable of being planarized at about the same rate as the barrier layer of first electrically conductive material; and b) then planarizing the structure to remove:
  i) the planarizable material;
  ii) the filler layer of second electrically conductive material; and
  iii) the barrier layer of first electrically conductive material;
    above the upper surface of the dielectric material;

whereby the planarizable material above the filler layer of second electrically conductive material in the trenches protects the second electrically conductive material while the barrier layer of first electrically conductive material is being removed from the upper surface of the dielectric layer by the planarizing step, to prevent erosion of the upper surface of the second electrically conductive layer in the trenches.

The barrier layer of first electrically conductive material will comprise a material capable of being deposited over dielectric surfaces as a highly conformal layer which is capable of forming a barrier layer to prevent diffusion of the second electrically conductive material into the dielectric material and also capable of promoting adhesion between the dielectric material and the second electrically conductive material. Examples of suitable first electrically conductive materials include: tantalum metal, tantalum nitride, tungsten metal, tungsten nitride, titanium metal, or titanium nitride, or combinations of same. The barrier layer may be blanket deposited over the surfaces of the trenches and the upper surface of the dielectric layer by any suitable deposition process such as chemical vapor deposition (CVD), plasma enhanced chemical vapor deposition (PECVD), or physical vapor deposition to a thickness of from about 100 Å to about 1000 Å. Thicknesses less than 100 Å may be insufficient to provide the desired barrier diffusion protection, while thicknesses exceeding about 1000 Å may interfere with subsequent filling of the trench with the second electrically conductive material.

The filler layer of second electrically conductive material will comprise a material having a superior electrically conductivity to the first electrically conductive material. Examples of such electrically conductive materials include copper, tungsten, and aluminum. The thickness of the filler layer, as will be further discussed below, will range from that amount which, in combination with the thickness of the planarizable layer, will at least fill the trench after the planarization step, while the maximum thickness should not, prior to the planarization step, exceed that amount which would fill the trench to a plane lying in the upper surface of the dielectric layer. That is, the surface of the filler material in the trench should not be so high that the planarizable material forming a protective layer over the filler material in the trench is completely removed in the planarization process 100 Å to about 1000 Å prior to the removal of all of the barrier layer on the upper surface of the dielectric layer.

The planarizable layer (or buffer layer) may comprise any material capable of being removed by a chemical-mechanical polishing (CMP) process to facilitate the planarizing step as will be discussed below. Preferably, the planarizable layer comprises a material capable of being planarized by a CMP process at about the same rate as the barrier layer of first electrically conductive material. When the planarizable layer is completely removed during the planarization step, the planarizable layer may comprise either electrically conductive material or electrically non-conductive material. However, when not all the planarizable layer is removed during the planarization step, planarizable layer should comprise an electrically conductive material such as, for example, tantalum, tantalum nitride, titanium, titanium nitride, niobium, and niobium nitride. When it is not necessary that the planarizable layer be electrically conductive, to the above list may be added silicon nitride.

The process of the invention finds particular utility with respect to the protection of metal filler in trenches during subsequent planarizing by CMP to remove portions of the metal filler material blanket deposited on the upper surface of the dielectric material in which the trenches are formed. However, even though the cross-sectional area of vias is generally smaller than that of trenches, the process may also be used in connection with the filling of vias with metal filler material, since the same subsequent removal of metal filler material blanket deposited on the upper surface of the dielectric material must also be carried out for the filling of vias.

The planarizing process used to remove from the upper surface of the dielectric layer all of the barrier layer, all of the filler layer, and all of the planarizable layer; and to planarize the remaining materials in the trenches preferably comprises a chemical-mechanical polishing (CMP) process wherein the chemical etchant and mechanical abrasive in the CMP slurry are selected for the particular material being planarized. For example, when tantalum or tantalum nitride are used as either or both the filler layer and the planarizable layer, a CMP slurry containing hydrogen peroxide ($H_2O_2$) and silica ($SiO_2$) can be used to polish away these materials. Such a slurry is commercially available from, for example, Planar Solutions as Arch Cu-10K-2. When the filler layer of second electrically conductive material comprises, for example, copper, a CMP slurry containing hydrogen peroxide ($H_2O_2$) and alumina ($Al_2O_3$) can be used to polish away the unwanted copper. Such a CMP slurry is commercially available from, for example, the Cabot Company as Cabot EPC 5001.

Turning now to FIGS. 4–6, the improved process of the invention is illustrated. As seen in FIG. 4, before planarizing the structure of prior art FIG. 1 to remove the portions of filler layer 40 of second electrically conductive material and barrier layer 30 of first electrically conductive material from the upper surface of the dielectric layer, a planarizable layer 60 is formed over layer 40 of second electrically conductive material. The planarizing process is then commenced after formation of planarizable layer 60 thereon.

In FIG. 5, the process of the invention is shown after commencement of the planarizing step, showing, at this point, the complete removal of those portions of both planarizable layer 60 and filler layer 40 which formerly lay over barrier layer 30 on the upper surface of dielectric layer 20. It will be noted that at this point in the planarization process substantially none of the portions of barrier layer 30 lying over the top surface of dielectric layer 20 have been removed. However, it will be further noted in FIG. 5 that small portions of planarizable layer 60, denoted at 62 and 64 remain over segments 42 and 44 of filler layer 40 which are in trenches 22 and 24. That is, at least the central portion of segments 42 and 44 of filler layer 40 of second electrically conductive material lying in trenches 22 and 24 are protected from the planarizable process at this point by portions 62 and 64 of planarizable layer 60 during the subsequent removal of the remainder of barrier layer 30 over the top surface of dielectric layer 20.

It will be apparent that for portions 62 and 64 of planarizable layer 60 to protect the surface of segments 42 and 44 of layer 40 of second electrically conductive material in trenches 22 and 24 during this latter portion of the planarization process, the thicknesses of one or both of filler layer 40 and planarizable layer 60 must be carefully controlled. For example, if filler layer 40 is too thick, i.e., the top surface of filler layer 40 in the trenches is too high, all of planarizable layer 60 over the trenches will be gone by the time the planarization process reaches the stage shown in FIG. 5, with respect to the exposure of the portions of barrier layer 30 over the upper surface of dielectric layer 20. This would, in turn, lead to the same problem of surface erosion of filler layer 40 of second electrically conductive material as previously shown in prior art FIG. 3.

Ideally (presuming that barrier layer 30 and planarizable layer 60 comprise materials which will polish at the same rate), the height of filler layer 40 in the central portion of the trenches (prior to the planarization step) should be equal to the height of dielectric layer 20 beneath barrier layer 30, as shown in FIG. 4; and the thickness of planarizable layer 60 over the trenches should be at least equal to the thickness of barrier layer 30 over the top surface of dielectric layer 20. Then when the planarization process reaches the stage shown in FIG. 5, i.e., the point where barrier layer 30 becomes exposed to the planarization process, the remaining thickness of planarization layer 60 over/in the trenches (shown at 62 and 64 in FIG. 5) will be equal to the thickness of barrier layer 30 over dielectric layer 20 so that subsequent removal of all of barrier layer 30 over dielectric layer 20 will occur at the same time as removal of the last amount of planarizable layer 60, resulting in the structure shown in FIG. 6. In such case, whether or not planarization layer 60 comprises an electrically conductive material or an insulator will not matter.

However, since it may be difficult to repeatably achieve the structure shown in FIG. 6, it may be more desirable to always use an electrically conductive material for planarization layer 60. In that case, the original thickness or height of filler layer 40 of second electrically conductive material in the trenches may be designed to range from slightly less than the height of the upper surface of dielectric layer 20 up to not greater than the height of the upper surface of dielectric layer 20, where "slightly less" may defined as not exceeding about 50 nanometers (nm). That is, the lower surface of the layer of planarizable material above the filler layer of second electrically conductive in the trench lies in or below the plane of the upper surface of dielectric layer 20 before the planarizing step. The upper surface of the layer of planarizable material above the filler layer of second electrically conductive in the trench lies in or above the plane of the upper surface of barrier layer 30 over the upper surface of the dielectric layer before the planarizing step. Then, when the planarization process is completed, the upper surface of the remaining planarizable layer in the trench will lay substantially in the plane of the upper surface of the dielectric material after the planarizing step. Thus, the practice of the process of the invention will result in either the structure shown in FIG. 6, or a structure having a small amount of planarizable layer 60 left over the top of filler layer 40 in the trenches after the planarization step.

It will be appreciated, however, that the above discussed results may be altered by the respective use of materials for barrier layer 30 and planarizable layer 60 which do not planarize at the same rate. In such case, the relative thicknesses of such materials (as well as the height of layer 40) will need to be adjusted to compensate for such differences in planarization rates. It will be readily apparent that such may not be the preferred mode of operation. However, if the need for the use of certain materials for the respective layers arises for other reasons dictating such use, it will be preferred to select a material for barrier layer 30 which planarizes at a faster rate than planarizable layer 60 to provide the desired protection for the upper surface of layer 40 in the trenches during the planarization process.

While the foregoing description of the process of the invention relates to its use in the single damascene type structure, it will be readily appreciated by those skilled in the art that the same improvements can be used in a double damascene process as well where previously formed vias in a first dielectric layer are lined and filled at the same time as the trenches formed in a second dielectric layer are lined and filled respectively with first and second electrically conductive material.

This is illustrated in FIG. 7 wherein a first dielectric layer 70 is formed over integrated circuit structure 10, and vias 72 and 74 are cut through layer 70 to underlying integrated circuit structure 10. Dielectric layer 20 of FIG. 4 is formed over dielectric layer 70, and trenches 22 and 24 are formed in dielectric layer 20 in registry with underlying vias 72 and 74, as also shown in FIG. 7. Trenches 22 and 24 and vias 72 and 74 are then lined with barrier layer 30' of first electrically conductive material by blanket deposit of same. Vias 72 and 74 and trenches 22 and 24 are then filled with a blanket deposit of a second electrically conductive material such as copper to form filler layer 40'. In accordance with the invention planarizable layer 60 is then blanket deposited over filler layer 40'. The planarization process then proceeds as previously described, resulting again in the complete filling of trenches 22 and 24 with filler layer 40' of second electrically conductive material, and with a planarized upper surface on the material used to fill trenches 22 and 24, resulting in the finished structure shown in FIG. 8, having the same planarized upper surface as previously illustrated for the single damascene product in FIG. 6.

A flow sheet illustrating one embodiment of the process of the invention is depicted in FIG. 9. The process proceeds by forming one or more trenches in a dielectric layer on an integrated circuit structure; blanket depositing a thin barrier layer of electrically conductive material over the dielectric material to form a liner on the walls of the one or more trenches; blanket depositing over the barrier layer a second layer of a different electrically conductive material to substantially fill the one or more trenches; forming over the second layer a planarizable layer capable of being planarized at about the same rate as the barrier layer; and planarizing the structure to remove all of the barrier layer, the second layer, and the planarizable layer on the upper surface of the dielectric layer, with the portion of the planarizable layer over the second layer in the one or more trenches serving to protect the second layer during the removal of the barrier layer to prevent erosion of the top surface of the second layer in the one or more trenches.

To further illustrate the invention, two silicon wafers may each have formed thereon a 650 nanometer (nm) thick silicon oxide dielectric layer with one or more 10×10 square micrometer ($\mu m^2$)×650 nm deep trenches formed therein. A 25 nm thick layer of tantalum is blanket deposited over each of the wafers to form a liner on the walls of the respective trenches. A 650 nm thick layer of copper is then blanket deposited over the tantalum layer on one of the wafers to completely fill up the respective trenches with copper on that wafer. Slightly less copper is deposited in the trenches of the other wafer to substantially fill up the trenches on that wafer (i.e., about 600–625 nm of copper). In accordance with the invention, the wafer having the trenches substantially filled with copper is then subject to a further blanket deposit of a second layer of tantalum, having a thickness of about 50 nm (in the regions where no trenches were present, i.e., as measured to the top surface of the dielectric layer) to complete the filling of the trenches on this wafer.

This wafer (with the two layers of tantalum thereon) is then subjected to a first CMP step using an Arch Cu-10k-2 slurry designed for barrier layer removal containing hydrogen peroxide and particulate silica as the abrasive, to polish the second layer of tantalum sufficiently down to expose the underlying copper layer in the regions where the layers are on the upper surface of the dielectric layer (non-trench regions). The CMP slurry is then changed to a Cabot EPC 5001 slurry designed for copper removal, and containing hydrogen peroxide and particulate alumina as the abrasive, to polish the copper. Both wafers would then be subjected to CMP planarizing of the copper until the tantalum barrier layer beneath the copper layer becomes exposed in the regions over the top surface of the dielectric layer (non-trench regions). The CMP slurry would then be changed back to the previous Arch slurry and the first layer of tantalum would then be removed on each wafer to expose the top surface of the underlying dielectric layer on each of the two wafers.

The wafers are then removed from the polishing station, rinsed, and dried, and then examined under an atomic force microscope (AFM). The surfaces of the copper-filled trenches on the wafer not having the second layer of tantalum deposited over the copper layer will be found to be eroded, leaving concave or dished upper surfaces in the trenches, due to attack and erosion of the unprotected faster etching copper layer during removal of the first layer of tantalum. The surfaces of the copper-filled trenches on the second wafer (having the second layer of tantalum deposited over the copper layer in accordance with the invention) will be found to be substantially planar, i.e., not significantly dished compared to the first wafer, due to the protection afforded the upper surface of the copper filler in the trenches during the removal of the first layer of tantalum.

Thus, the invention provides an improved process for forming metal lines or interconnects in a previously formed pattern of trenches in a dielectric layer, as well as for forming filled vias, wherein erosion or dishing of the upper surface of the main metal filler material such as copper, tungsten, or aluminum is prevented or inhibited by the provision of protective materials over the upper surfaces of such copper, tungsten, or aluminum material in trenches (or vias) during the removal of surfaces portions of an underlying barrier layer.

Having thus described the invention what is claimed is:

1. In a process for forming an integrated circuit structure wherein trenches and/or vias are formed in a predetermined pattern in a dielectric layer, lined with a barrier layer of a first electrically conductive material, and then filled with a second electrically conductive material, and said structure is then planarized to remove said first and second electrically conductive material from the upper surface of said dielectric layer, the improvements which comprise:
   a) before said planarizing step, forming over said second electrically conductive material a layer of a planarizable material, wherein the thickness of said layer of planarizable material above said second electrically conductive material in said trenches and/or vias is at least equal to the thickness of said barrier layer above said upper surface of said dielectric layer; and
   b) planarizing said structure to remove:
      i) said planarizable material;
      ii) said second electrically conductive material; and
      iii) said first electrically conductive material;
         above said upper surface of said dielectric layer;
whereby said planarizable material above said second electrically conductive material in said trenches and/or vias protects said second electrically conductive material in said trenches and/or vias while said first electrically conductive material is being removed from said upper surface of said dielectric layer by said planarizing step to prevent erosion of the upper surface of said second electrically conductive layer in said trenches and/or vias.

2. The process of claim 1 wherein said planarizable material is capable of being planarized at about the same rate as the barrier layer of first electrically conductive material.

3. The process of claim 2 wherein the lower surface of said layer of planarizable material above said second electrically conductive material in said trenches and/or vias lies in or below the plane of said upper surface of said dielectric layer before said planarizing step.

4. The process of claim 2 wherein the upper surface of said layer of planarizable material above said second electrically conductive material in said trenches and/or vias is above the plane of said upper surface of said dielectric layer before said planarizing step.

5. The process of claim 2 wherein portions of said layer of planarizable material lying in said trenches and/or vias remain after said planarizing step, and the upper surface of the remaining portions of said layer of planarizable material in said trenches and/or vias lies substantially in the plane of said upper surface of said dielectric layer after said planarizing step.

6. The process of claim 2 wherein portions of said layer of planarizable material remain after said planarizing step, and the upper surface of said second electrically conductive material in said trenches and/or vias lies substantially in a plane below said upper surface of said dielectric layer, and the upper surface of the remaining portions of said layer of planarizable material lies substantially in the plane of said upper surface of said dielectric layer after said planarizing step, and said planarizable material comprises an electrically conductive material.

7. The process of claim 1 wherein said planarizing step comprises a chemical-mechanical polishing process.

8. The process of claim 1 wherein said second electrically conductive material is selected from the group consisting of copper, tungsten, and aluminum.

9. The process of claim 1 wherein said second electrically conductive material comprises copper.

10. The process of claim 1 wherein said first electrically conductive material is selected from the group consisting of tantalum, tantalum nitride, titanium, titanium nitride, niobium, and niobium nitride.

11. The process of claim 1 wherein said planarizable material is selected from the group consisting of tantalum, tantalum nitride, titanium, titanium nitride, niobium, niobium nitride, and silicon nitride.

12. The process of claim 1 wherein:
a) prior to the planarization step, the thickness of said barrier layer above said upper surface of said dielectric layer is substantially the same as the thickness of said layer of planarizable material above said second electrically conductive material in said trenches and/or vias; and
b) the upper surface of said barrier layer above said upper surface of said dielectric layer lies substantially in the same plane as the upper surface of said planarizable material above said trenches and/or vias;
whereby subsequent complete removal of said barrier layer above said upper surface of said dielectric layer will occur during said planarizing step at about the same time as complete removal of said planarizable material above said second electrically conductive material in said trench occurs, leaving a planarized surface on said dielectric layer lying in the same plane as the planarized surface on the materials in said trenches and/or vias.

13. The process of claim 1 wherein said dielectric layer comprises trenches formed therein, and said integrated circuit structure further comprises a second dielectric layer below said dielectric layer having said trenches formed therein, and said second dielectric layer has one or more vias or contact openings therein formed in registry with said trenches, said vias or contact openings lined with said barrier layer of first electrically conductive material and then filled with said filler layer of second electrically conductive material.

14. In a process for forming an integrated circuit structure wherein trenches and/or vias are formed in a predetermined pattern in a dielectric layer, lined with a barrier layer of a first electrically conductive material, and then filled with a second electrically conductive material, and said structure is then planarized to remove said first and second electrically conductive material from the upper surface of said dielectric layer, the improvements which comprise:
a) before said planarizing step, forming over said second electrically conductive material a layer of a planarizable material having an upper surface over said trenches and/or vias in or above the plane of the upper surface of said barrier layer; and
b) planarizing said structure to remove:
i) said planarizable material;
ii) said second electrically conductive material; and
iii) said first electrically conductive material;
above said upper surface of said dielectric layer;
whereby said planarizable material above said second electrically conductive material in said trenches and/or vias protects said second electrically conductive material in said trenches and/or vias while said first electrically conductive material is being removed from said upper surface of said dielectric layer by said planarizing step to prevent erosion of the upper surface of said second electrically conductive layer in said trenches and/or vias.

15. In a process for forming an integrated circuit structure wherein trenches are formed in a predetermined pattern in a dielectric layer, lined with a barrier layer of a first electrically conductive material, and then filled with copper, and said structure is then planarized by a CMP process to remove said first electrically conductive material and said copper from the upper surface of said dielectric layer, the improvements which comprise:
a) before said planarizing step, forming over said copper, a layer of a planarizable material capable of being planarized at about the same rate as the barrier layer of first electrically conductive material, said planarizable layer having:
i) a lower surface in said trenches lying in or below the plane of said upper surface of said dielectric layer;
ii) an upper surface over said trenches in or above the plane of the upper surface of said barrier layer; and
iii) a thickness, over said upper surface of said dielectric layer, at least equal to the thickness of said barrier layer over said upper surface of said dielectric layer; and
b) planarizing said structure by a CMP process to remove:
i) said planarizable material;
ii) said copper; and
iii) said first electrically conductive material;
above said upper surface of said dielectric material, wherein complete removal of said barrier layer of said first electrically conductive material over said upper surface of said dielectric layer will occur at about the same time as complete removal of portions of said planarizable layer lying above the plane of said upper surface of said dielectric material;
whereby said planarizable material above said copper in said trenches protects said copper in said trenches while said first electrically conductive material is being removed from said upper surface of said dielectric layer by said planarizing step to prevent erosion of the upper surface of said copper in said trenches.

16. The process of claim 15 wherein said planarizable layer has a lower surface in said trenches lying below the plane of said upper surface of said dielectric layer.

17. The process of claim 15 wherein said planarizable layer has an upper surface over said trenches above the plane of the upper surface of said barrier layer.

18. The process of claim 15 wherein said planarizable layer has:
a) a lower surface in said trenches lying below the plane of said upper surface of said dielectric layer; and
b) an upper surface over said trenches above the plane of the upper surface of said barrier layer.

19. The process of claim 15 wherein said first electrically conductive material is selected from the group consisting of tantalum, tantalum nitride, titanium, titanium nitride, niobium, and niobium nitride.

20. The process of claim 15 wherein said first electrically conductive material is selected from the group consisting of titanium and titanium nitride.

21. In a process for forming an integrated circuit structure wherein trenches are formed in a predetermined pattern in a dielectric layer; lined with a barrier layer of a first electrically conductive material selected from the group consisting of tantalum, tantalum nitride, titanium, titanium nitride, niobium, and niobium nitride; and then filled with copper; and said structure is then planarized to remove said first electrically conductive material and said copper from the upper surface of said dielectric layer, the improvements which comprise:
a) before said planarizing step, forming over said copper, a layer of a planarizable material, said planarizable layer:
i) having a lower surface in said trenches lying in or below the plane of said upper surface of said dielectric layer;
ii) having an upper surface over said trenches in or above the plane of the upper surface of said barrier layer;
iii) having a thickness, over said upper surface of said copper in said trenches, at least equal to the thickness of said barrier layer over said upper surface of said dielectric layer; and iv) capable of being planarized at about the same rate as the barrier layer of first electrically conductive material; and b) planarizing said structure to remove:
   i) said planarizable material;
   ii) said copper; and
   iii) said first electrically conductive material;
   above said upper surface of said dielectric layer;
whereby said planarizable material above said copper in said trenches protects said copper in said trenches while said first electrically conductive material is being removed from said upper surface of said dielectric layer by said planarizing step to prevent erosion of the upper surface of said copper in said trenches.

22. The process of claim 21 wherein said first electrically conductive material is selected from the group consisting of titanium and titanium nitride.

23. The process of claim 21 wherein the upper surface of said barrier layer above said upper surface of said dielectric layer lies substantially in the same plane as the upper surface of said planarizable layer above said trench; whereby subsequent complete removal of said barrier layer above said upper surface of said dielectric layer will occur during said planarizing step at about the same time as complete removal of said planarizable material above said copper in said trench occurs, leaving a planarized surface on said dielectric layer lying in the same plane as the planarized surface on the materials in said trenches.

* * * * *